United States Patent [19]

Norimatsu

[11] Patent Number: 5,656,972

[45] Date of Patent: Aug. 12, 1997

[54] METHOD AND DEVICE FOR CONTROLLING OUTPUT POWER OF A POWER AMPLIFIER

[75] Inventor: Hidehiko Norimatsu, Tokyo, Japan

[73] Assignee: NEC Corporation, Tokyo, Japan

[21] Appl. No.: 546,503

[22] Filed: Oct. 20, 1995

[30] Foreign Application Priority Data

Oct. 21, 1994 [JP] Japan ................... 6-282924

[51] Int. Cl.$^6$ ....................................... H03G 3/30
[52] U.S. Cl. ........................... 330/129; 330/279
[58] Field of Search ..................... 330/129, 141, 330/279, 281; 455/126

[56] References Cited

U.S. PATENT DOCUMENTS

| | | | |
|---|---|---|---|
| 5,101,173 | 3/1992 | DiPiazza et al. | 330/279 X |
| 5,194,822 | 3/1993 | Bureau et al. | 330/129 |

FOREIGN PATENT DOCUMENTS

| | | |
|---|---|---|
| 0 086 514 | 8/1983 | European Pat. Off. |
| 5-9018 | 2/1993 | Japan. |
| WO86/07216 | 12/1986 | WIPO. |

OTHER PUBLICATIONS

Patent Abstracts of Japan, vol. 011, No. 092 (E-491), 24 Mar. 1987 (JP-A-61 242406).

*Primary Examiner*—Steven Mottola
*Attorney, Agent, or Firm*—Sughrue, Mion, Zinn, Macpeak & Seas

[57] ABSTRACT

In a device for controlling the output power of a power amplifier, an output control signal varies the gain of the power amplifier. A detector detects the output power of the amplifier. A signal processing circuit receives the output of the detector and a control signal from the outside and controls the gain of the amplifier. A EEPROM stores corresponding sets of detection outputs and output control signals each corresponding to particular power to be output from the amplifier. The signal processing circuit reads out from the EEPROM, based on the outside control signal and the output of the detector, a corresponding one of the output control signals. The corresponding output control signal which is read out of the EEPROM is fed to the control terminal of the power amplifier to control its gain.

11 Claims, 5 Drawing Sheets

| ADDRESS | DATA | DATA |
|---|---|---|
| OUTPUT POWER | OUTPUT CONTROL SIGNAL VALUE | DETECTION OUTPUT VALUE |
| ¦ | ¦ | ¦ |
| ¦ | ¦ | ¦ |
| ¦ | ¦ | ¦ |
| ¦ | ¦ | ¦ |

METHOD AND DEVICE FOR CONTROLLING OUTPUT POWER OF A POWER AMPLIFIER

BACKGROUND OF THE INVENTION

Field of the Invention

The present invention relates to a method of controlling the output power of a power amplifier, and a device therefor.

Control devices for automatically controlling the output of a power amplifier using a feedback scheme have been proposed in various forms in the past. This type of control device detects power output from a power amplifier, compares it with a reference value, and controls the gain of the amplifier such that the difference between the detected power output and the reference value is reduced to zero or to a particular value. As a result, the output power of the amplifier is automatically controlled to be at a predetermined target value. Such a control device is disclosed in Japanese Utility Model Laid-Open Publication No.-5-9018 by way of example.

The conventional feedback type control device is implemented as a so-called closed loop. Hence, when the gain of the loop is increased in order to enhance the response of the control over the output voltage, the stability of the control loop is deteriorated, a result which is well understood from the general theory of control systems. Consequently, the power amplifier output becomes unstable even when the predetermined output must be maintained. Moreover, in practice, the closed loop each has a frequency characteristic based on the frequency response of its constituent parts and is apt to oscillate when the loop gain is greater than 1. This frequency characteristic also causes the phase to be inverted. The increase in loop gain aggravates the probability of oscillation. Therefore, the loop gain cannot be increased beyond a certain limit, resulting in slow control response.

SUMMARY OF THE INVENTION

It is therefore an object of the present invention to provide a method of controlling the output of a power amplifier accurately and stably while improving control response, and a device therefor.

In accordance with the present invention, a device for controlling the output power of a power amplifier has a power amplifier having a gain that is variable in response to an output control signal. A detector detects the output power of the power amplifier. A signal processing circuit feeds the output control signal to the power amplifier in response to a detection output of the detector and an outside control signal that fed from the outside for controlling the output power of the power amplifier. A storage device stores various values of the detector output and various values of the output control signal in correspondence with various values of the power to be output from the power amplifier. The signal processing circuit reads from the storage device, in response to the detector output and the outside control signal input thereto, a corresponding one of the various stored values of the output control signal and feeds it to the power amplifier to thereby control the gain of the power amplifier.

Preferably, the signal processing circuit performs comparisons, at a predetermined time intervals, of a detection output read out of the storage with the detection output input thereto and varies the output control signal such that the difference between the two detection outputs decreases. Also, when the difference is greater than a predetermined value, the signal processing circuit divides the difference by a predetermined number and then varies the output control signal, based on the divided difference, stepwise.

The storage device stores the various values of the output power as addresses, and stores the various values of the detection output and the various values of the output control signal as the contents of the respective addresses.

Also, a method according to the present invention controls the output power of a power amplifier. The method has the steps of detecting the output power of the power amplifier, inputting a detector output representative of the output power and an outside control signal for controlling the output power, feeding an output control signal to the power amplifier, reading, in response to the detector output and outside control signal input, an output control signal stored beforehand and matching the detector output and outside control signal, and feeding the output control signal to the power amplifier to thereby control the gain of the amplifier.

BRIEF DESCRIPTION OF THE DRAWINGS

The above and other objects, features and advantages of the present invention will become more apparent from the following detailed description taken with the accompanying drawings in which.

In the drawings, the same reference numerals are used to denote common structural elements.

DESCRIPTION OF THE PREFERRED EMBODIMENTS

Figure 1:
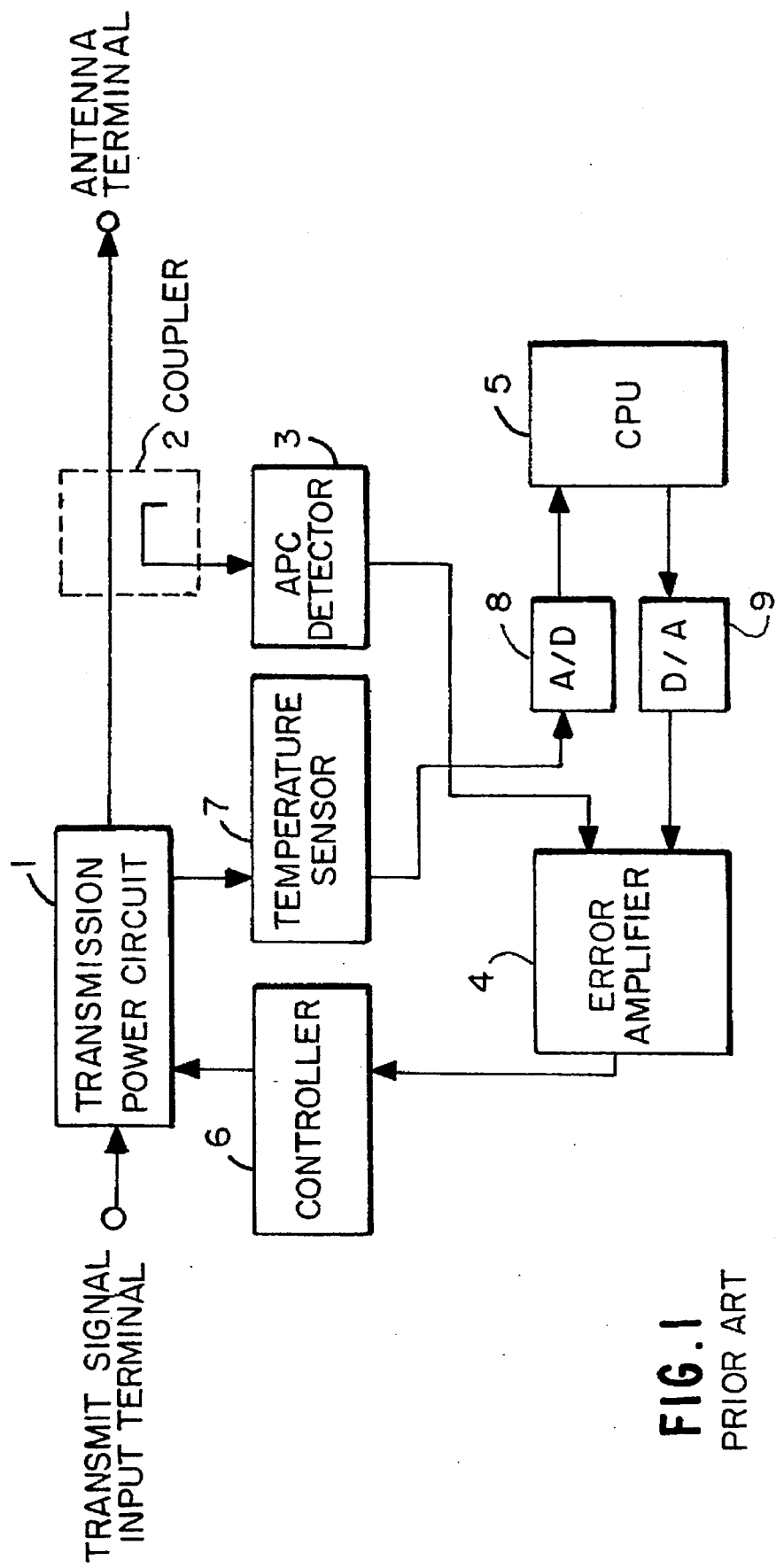
FIG. 1 is a block diagram schematically showing a conventional output control device.

First, to facilitate an understanding of the present invention, a prior art output control device will be described with reference to FIG. 1. As shown, the output control device has a transmission power circuit 1, a directional coupler 2, an APC detector 3, an error amplifier 4, a CPU 5, a controller 6, a temperature sensor 7, an analog-to-digital (A/D) converter 8, and a digital-to-analog (D/A) converter 9.

In operation, the directional coupler 2 separates a portion of the output of the transmission power circuit 1 and couples it to the APC detector 3. The resulting output of the detector 3 is applied to the error amplifier 4. In response, the error amplifier 4 compares the output of the detector 3 and a reference voltage fed from the CPU 5 (via D/A converter 9) and delivers a difference between them, i.e., an error signal, to the controller 6. The controller 6 controls the gain of the transmission power circuit 1 on the basis of the error signal. The CPU 5 corrects the reference voltage, and therefore the output of the transmission power circuit 1 on the basis of temperature sensed by the temperature sensor 7 and conveyed to the CPU via A/D converter 8.

The above feedback control based on the output of the power amplifier constitutes a so-called closed loop. This brings about a problem that when the loop gain is increased in order to enhance the response of the output power control, the stability of the loop gain is deteriorated to, in turn, render the output voltage unstable, as discussed earlier. Another problem is that the frequency response of the constituent components of the closed loop contribute to give the loop a frequency characteristic according to which the loop is apt to oscillate when the loop gain is increased.

In light of the above, an output control device not relying on a closed loop may be contemplated and is practicable if a control signal is fed from the outside of the device. With this kind of scheme, i.e., by directly controlling the gain of the power amplifier by an outside control signal, it is possible to change the gain more rapidly. However, because the accuracy and stability of the control signal directly influences the output of the power amplifier, the control signal must be highly accurate and stable. With the state-of-the-art technologies, it is difficult to produce such an accurate and stable control signal, and therefore to accurately and stably control the output of the power amplifier.

Figure 2:
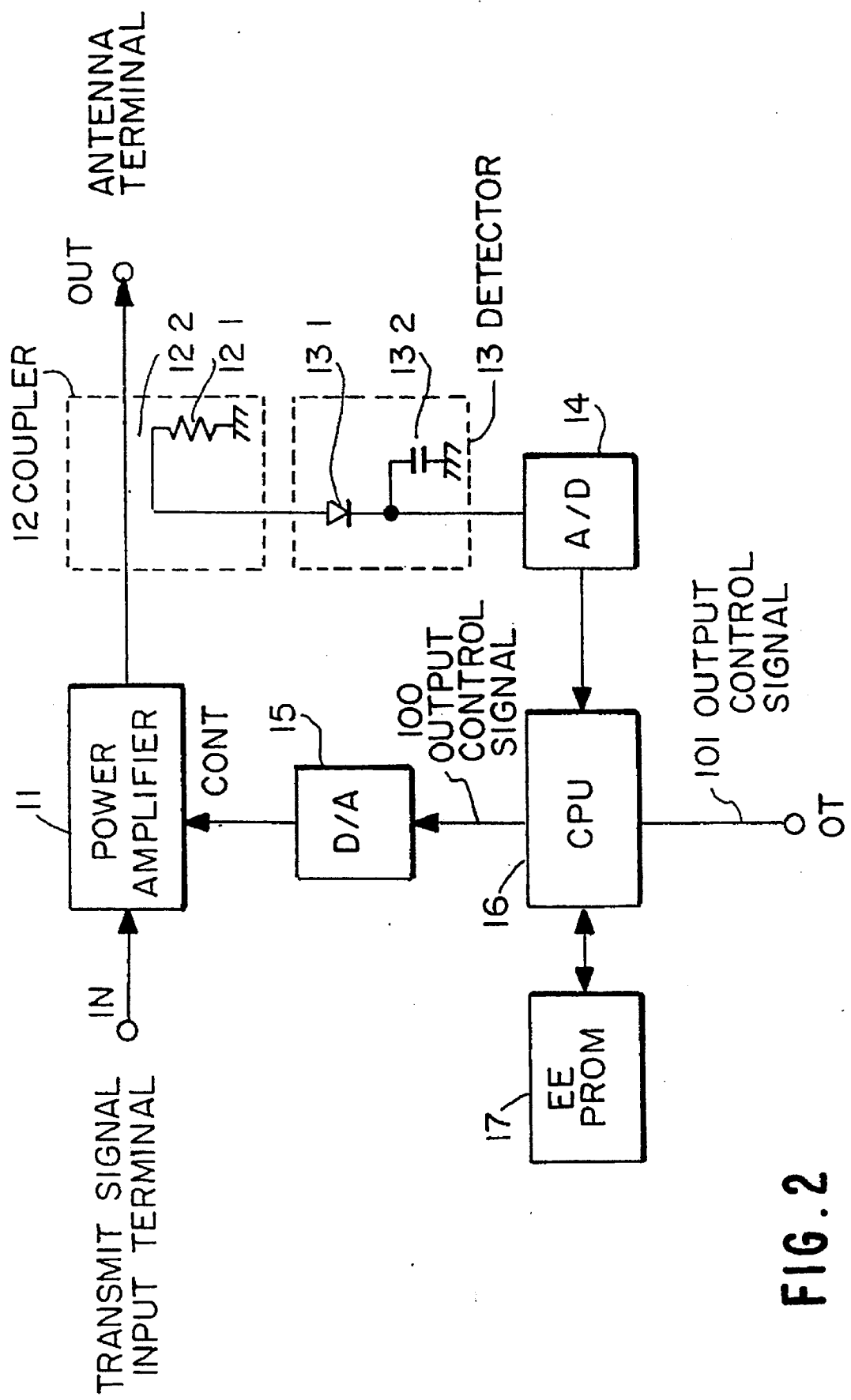
FIG. 2 is a block diagram schematically showing an output control device embodying the present invention.

Referring to FIG. 2, an output power control device for a power amplifier is shown which embodies the present invention. As shown, the control device has a power amplifier 11, a coupler 12, a detector 13, an A/D converter 14, a D/A converter 15, a CPU 16, and a storage device 17 which may preferably be implemented by an EEPROM. The coupler 12 has a resistor 121 and a distributed constant circuit 122. The detector 13 has a diode 131 and a capacitor 132.

The power amplifier 11 receives a signal to be transmitted via an input terminal IN, amplifies the power of the signal to produce the amplified signal on an output terminal OUT which is connected to an antenna. The power amplifier 11 additionally has a control terminal CONT and is implemented as a variable gain control amplifier. A control signal is applied to the control terminal CONT in order to variably control the gain and, therefore, the output of the amplifier 11. The coupler 12 separates a portion of the power output of the amplifier 11 and couples it to the detector 13. The detector 13 detects the input signal and then outputs a DC voltage corresponding to the output level. The A/D converter 14 converts the DC voltage output from the detector 13 to a digital value.

The CPU 16 is connected to the control terminal CONT of the power amplifier 11 via the D/A converter 15. The D/A converter 15 transforms a control signal 100 output from the CPU 16 (referred to as an output control signal hereinafter) to an analog value and then delivers it to the amplifier 11. As a result, the gain of the amplifier 11 is controlled in accordance with the analog value.

The digital value or signal from the A/D converter 14 is applied to the CPU 16. The CPU 16 is capable of writing or reading data in or out of the storage device, preferably EEPROM, 17, as needed. An outside control terminal OT is connected to the CPU 16. The CPU 16 produces the output control signal 100 matching a control signal 101 fed thereto via the outside control terminal OT (referred to as an outside control signal hereinafter).

Figures 3, 5:
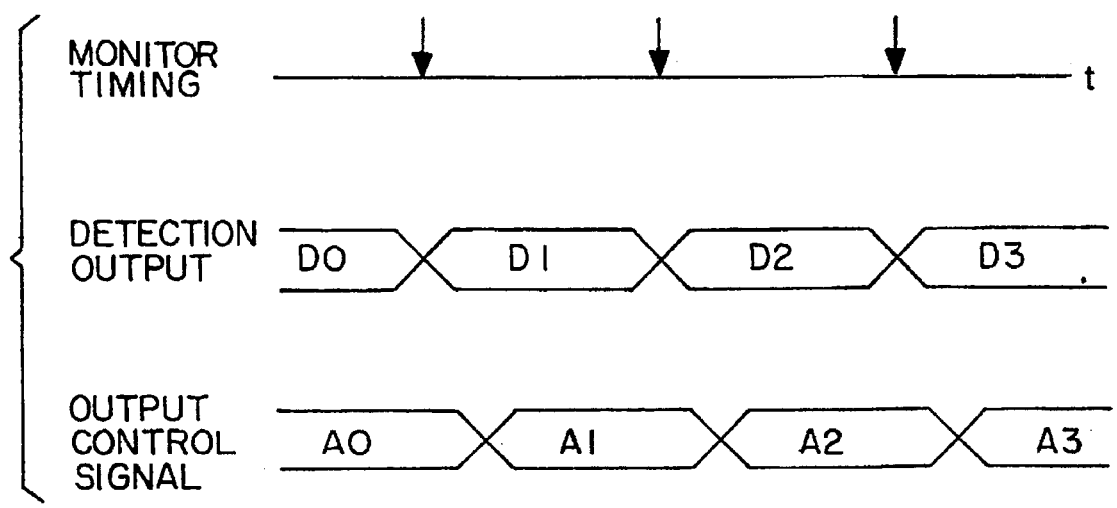
FIG. 3 shows an address map of a storage device included in the embodiment of FIG. 2.
FIG. 5 is a timing chart representative of a monitoring procedure particular to the CPU in the embodiment of FIG. 2.

FIG. 3 shows an address map representative of data stored in the storage device 17 at the time of initial set up. As shown, output power values to be actually output from the power amplifier 11 are stored in the storage device 17 as addresses. The outputs of the A/D converter 14 to be input to the CPU 16 and the output control signals 100 to be output from the CPU 16 to the D/A converter 15 and each corresponding to the respective output power, or address, are also stored in the storage device 17 as data. This can be done by sequentially varying the output control signal 100 in accordance with a preselected program, measuring the resulting outputs of the power amplifier 11, i.e., output power values as well as the resulting outputs of the A/D converter 14, and then writing them in the storage device 17 at a time.

Figure 4:
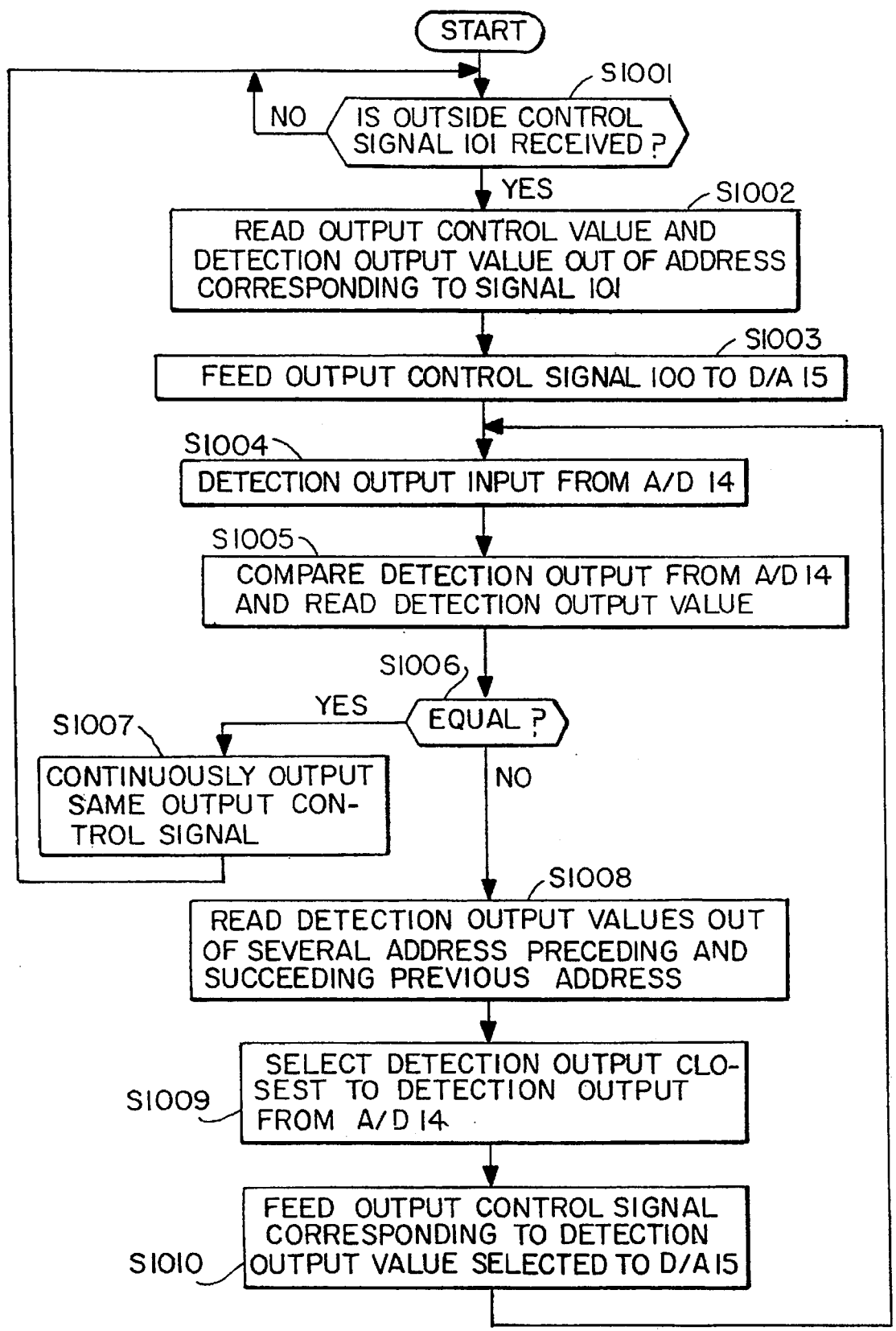
FIG. 4 is a flowchart demonstrating a first specific operation mode of the CPU in the embodiment of FIG. 2.

A reference will be made to FIG. 4 for describing a specific operation of the CPU 16. As shown, the CPU 16 determines whether or not it has received the outside control signal 101 via the outside control terminal OT (step S1001). The control signal 101 is representative of the target output value of the power amplifier 11. If the answer of the step S1001 is negative (NO), then the program returns. If the answer of the step S1001 is positive (YES), then the CPU 16 reads one of the output control signals 100 and one of the detector outputs out of the address of the storage 17 where the designated target output power value is stored (step S1002). The CPU 16 feeds only the output control signal 100 read out of the storage 17 to the D/A converter 15 (step S1003). The output control signal 100 is transformed to an analog signal by the D/A converter 15 and then input to the power amplifier 11 via the control terminal CONT. As a result, the power amplifier 11 has its gain controlled by the output control signal 100 and produces an amplified signal on the output terminal OUT.

The output of the power amplifier 11 is detected by the coupler 12 and detector 13 as a DC voltage at a predetermined monitoring time. The detected output is converted to a digital signal by the A/D converter 14 and then input to the CPU 16 (step S1004). In response, the CPU 16 compares the input detector output and the detector output read out of the storage device 17 previously (step S1005). If the two detector outputs compare equal (step 1006, YES), the CPU 16 does not vary the current value of the output control signal 100. Hence, the target output continuously appears on the output terminal OUT.

Assume that the detector output input to the CPU 16 from the A/D converter 14 is different from the detector output read out previously (step S1006, NO). Then, the CPU 16 determines that the target power is not output from the power amplifier 11, and changes the value of the output control signal 100 on the basis of the following specific steps. First, the CPU 16 reads the detector outputs out of several addresses preceding and succeeding the previous address (step S1008). Then, the CPU 16 selects one of the several detector outputs closest to the detector output actually input to the CPU 16 (step S1009). Subsequently, the CPU 16 read out the output control signal 100 stored in the same address as the detector output selected (step S1010) and then delivers it to the D/A converter 15 (step S1010). The control signal 100 varies the gain of the power amplifier 11. Therefore, the resulting detector output becomes closer to the detector output read out of the storage 17 first.

FIG. 5 shows how the CPU 16 receives, or monitors the detector output from the A/D converter 14 and delivers the output control signal 100 to the D/A converter 15 specifically. As shown, the CPU 16 receives a detector output from the A/D converter 14 at a time for monitoring, as indicated by an arrow in the figure. When the detector output is D0, the CPU 16 produces an output control signal 100 whose value is A0. As a result, at the next time for monitoring, the CPU 16 receives a detector output D1 and then produces an output control signal 100 whose value is A1. This is repeated until the target power appears on the output terminal OUT.

When the difference between an initially read out detector output and the actual detector output is great, an output control signal 100 representative of a great variation would be input to the D/A converter 15 from the CPU 16. However, this is apt to cause the output of the power amplifier 11 to sharply vary which would be a stability risk. Another specific operation 15 of the CPU 16 which obviates this problem will be described with reference to FIG. 6. Briefly, the CPU 16 divides the difference by a preselected value, increments or decrements (as appropriate) the address by the quotient, reads out an output control signal 100 stored in the resulting address, and then delivers it to the D/A converter 15. If the quotient has a residual, the CPU 16 further increments or decrements the address by 1 (one), reads an output control signal 100, and then delivers it to D/A converter 15. This successfully prevents the output of the power amplifier 11 from sharply varying.

Figure 6:
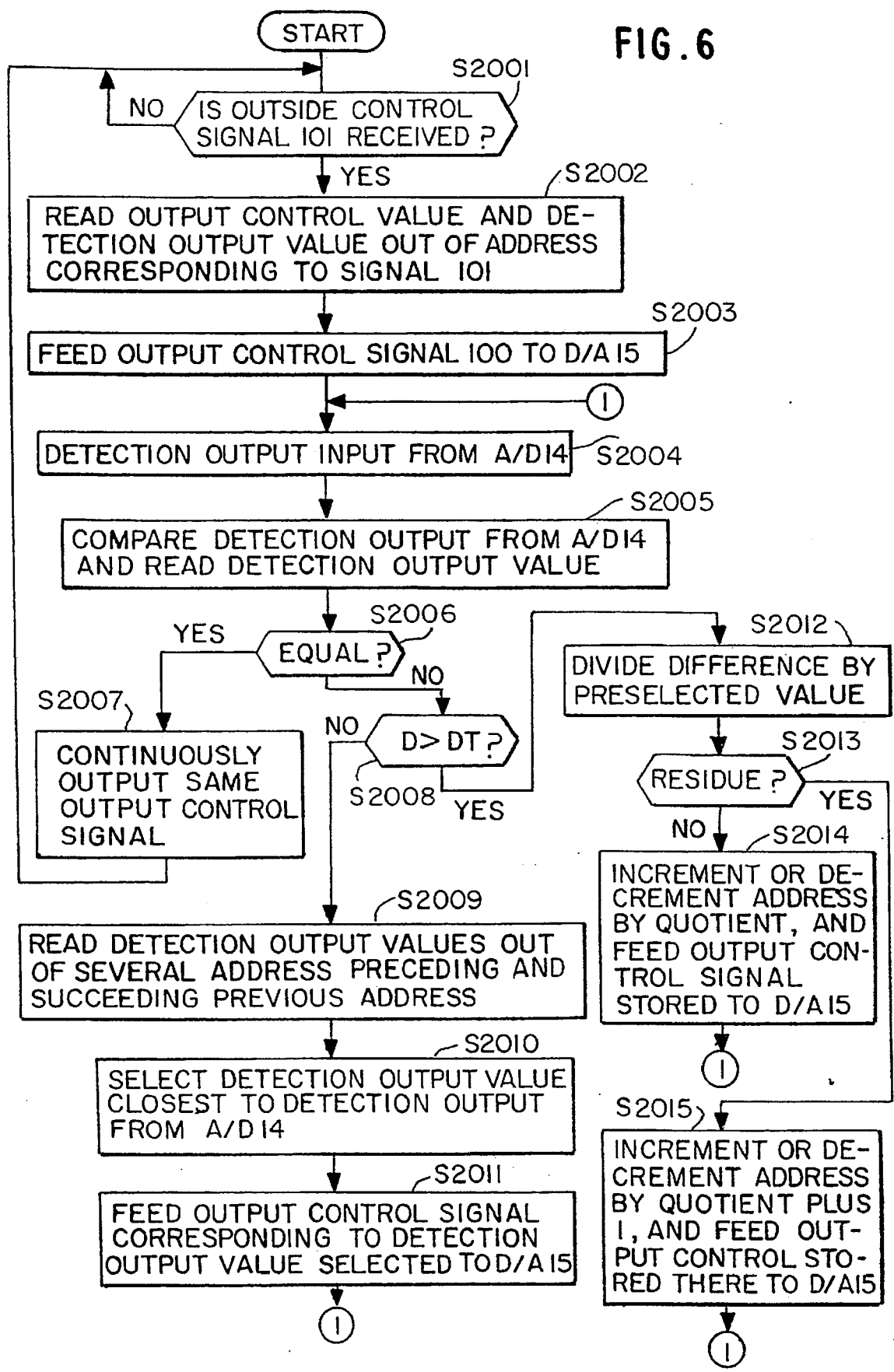
FIG. 6 is a flowchart demonstrating a second specific operation of the CPU.

FIG. 6 is a flow-chart illustrating the above-described function.

Specifically, in FIG. 6, steps S2001–S2007 are identical with the steps S1001–S1007 of FIG. 5, respectively, and will not be described in order to avoid redundancy. If a detector output $V_1$ from the A/D converter 14 is not equal to a detector output $V_2$ read out previously (step S2006, NO), the CPU 16 compares a difference D between the detector outputs $V_1$ and $V_2$ with a preselected reference value DT (step S2008). If the difference D is smaller then the reference value DT (step S2008, NO), the CPU 16 reads detector outputs stored in several addresses preceding and following the address read out previously (step S2009), selects the address storing a detector output closest to the actually input detector output (step S2010), and then delivers an output control signal 100 stored in the address selected to the D/A converter 15. This varies the gain of the power amplifier 11 and thereby allows the resulting detector output to be closer to the detector output read out previously.

If the difference D is greater than the reference value DT (step S2008, YES), the CPU 16 divides the difference D by a preselected value VT (step S2012). The CPU 16 determines whether or not the quotient of the division D/VT has a residue (step S2013). If the answer of the step 2013 is NO, the CPU 16 increments or decrements the address by the quotient, reads an output control signal 100 out of the incremented or decremented address, and then delivers it to the D/A converter 15 (step S2014). If the answer of the step S2013 is YES, the CPU 16 further increments or decrements the address by 1, reads an output control signal out of the resulting address, and then feeds it to the D/A converter 15 (step S2015). As a result, the output of the power amplifier 11 is prevented from sharply varying.

As stated above, the illustrative embodiment controls the gain of the power amplifier 11 on the basis of data stored in the storage device 17 beforehand. Hence, despite that the output of the power amplifier 11 is controlled by the closed loop constituted by the coupler 12, detector 13, A/D converter 14 and D/A converter 15, the output control signal 100 for the control is fed from the storage device 17 which is independent of the loop. Therefore, the control depends solely on the accuracy of data stored in the storage device 17; the response and accuracy of the output control is not related to the gain of the loop. At the same time, stable control over the output power is enhanced. In addition, the response will be further enhanced if the interval between the consecutive times for the CPU 16 to monitor the detector output (i.e., the sampling period) is reduced.

Although the embodiment controls the output power in response to an outside control signal, it implements fast control response because it reads data out of the storage device 17 on the basis of the outside control signal. Further, if the outside control signal is implemented by a digital signal, the embodiment can execute accurate and stable control without regard to the accuracy or the stability of the control signal.

In summary, in accordance with the present invention, a signal processing means reads, in response to an outside control signal and a detector output representative of the output power of a power amplifier, a corresponding output control signal out of a storage and controls the output power on the basis of the control signal. Hence, the output control signal is fed from the storage which is independent of a loop including a detector for detecting the power output and the signal processing means. It follows that the response and accuracy of the output control are not related to the gain of the loop. This implements highly accurate control relying solely on the accuracy of data stored in the storage, while promoting stable control. In addition, the response of the output control can be enhanced in matching relation to the operation speed of the signal processing means.

The signal processing means compares the detector output read out of the storage and the detector output appearing at predetermined intervals, and varies the output control signal such that a difference between them decreases. This allows the output power of the power amplifier to be automatically controlled to an adequate value matching the outside control signal.

When the difference between the two detector outputs is greater than a preselected value, the embodiment divides it by a preselected value, and then varies the output control signal a plurality of times stepwise on the basis of the quotient. Hence, the output power of the power amplifier is prevented from sharply varying.

Furthermore, the output power values of the power amplifier are stored in the storage device as addresses beforehand, while detector outputs and output control signals each matching the respective address are stored in the storage device. The embodiment, therefore, produces an output control signal matching desired output voltage immediately and thereby controls the gain of the amplifier rapidly, accurately, and stably.

While the invention has been described with reference to specific embodiments thereof, it will be appreciated by those skilled in the art that numerous variations, modifications and embodiments are possible, and accordingly, all such variations, modifications, and embodiments are to be regarded as being within the spirit and scope of the invention.

What is claimed is:

1. A device for controlling output power of a power amplifier, comprising:

a power amplifier having a gain variable in response to an output control signal;

detecting means for detecting output power of said power amplifier;

signal processing means for feeding said output control signal to said power amplifier in response to a detection output of said detecting means and an outside control signal fed from outside for controlling the output power of said power amplifier; and a storage device storing various values of said detection output and various values of said output control signal in correspondence with various values of the power to be output from said power amplifier;

wherein said signal processing means reads, in response to said detection output and said outside control signal input thereto, a corresponding one of said various values of said output control signal out of said storage device and feeds the output control signal having said value to said power amplifier to thereby control the gain of said power amplifier.

2. A device as claimed in claim 1, wherein said signal processing means compares a detection output read out of said storage device with said detection output input to said signal processing means at a predetermined time interval, and varies said output control signal such that a difference between said detection outputs decreases.

3. A device as claimed in claim 2, wherein when the difference is greater than a predetermined value, said signal processing means divides said difference by a predetermined number and then varies, based on the divided difference, said output control signal a plurality of times stepwise.

4. A device as claimed in claim 1, wherein said storage device stores said various values of the output power as addresses, and stores said various values of said detection output and said various values of said output control signal in the respective addresses.

5. A device for controlling output power of a power amplifier, comprising:

a D/A converter for converting a digital output control signal to an analog signal;

a power amplifier having a gain variable in response to said output control signal from said D/A converter;

a coupler for detecting a part of the output power of said power amplifier;

a detector for detecting an output of said coupler to thereby produce a corresponding DC voltage;

an A/D converter for converting an output of said detector to a digital value;

a CPU for feeding said digital output control signal to said D/A converter in response to an output of said A/D converter and an outside control signal input from outside for controlling the output of said power amplifier; and a ROM storing various values of a detection output to be output from said A/D converter and various values of said digital output control signal to be output from said CPU in correspondence with respective values of power to be output from said power amplifier;

wherein in response to the outside control signal and the output of said A/D converter said CPU reads corresponding one of said digital output control signals out of said ROM and feeds the one digital output control signal to said D/A converter.

6. A device as claimed in claim 5, wherein said CPU compares a detection output read out of said ROM with said detection output input to said signal processing means at a predetermined time interval, and varies said output control signal such that a difference between said detection outputs decreases.

7. A device as claimed in claim 6, wherein when the difference is greater than a predetermined value, said CPU divides said difference into a predetermined number and then varies, based on the divided difference, said output control signal a plurality of times stepwise.

8. A device as claimed in claim 5, wherein said ROM stores said output power values as addresses, and said detection outputs and said output control signals each corresponding to the respective address.

9. A method of controlling output power of a power amplifier, comprising the steps of:

detecting output power of a power amplifier;

inputting to a controller a detection output representative of the output power and an outside control signal for controlling the output power;

reading to the controller from a storage device, in response to said outside control signal input, a detection output stored beforehand and which is matched by the storage device with said outside control signal;

comparing said detection output representative of the output power with said detection output stored beforehand to determine an appropriate output control signal; and feeding said output control signal to said power amplifier to thereby control the gain of said power amplifier.

10. A method as claimed in claim 9, wherein said detection output is input at a predetermined time interval and compared with said detection output stored beforehand, and wherein said output control signal is varied such that a difference between said detection outputs decreases.

11. A method as claimed in claim 10, wherein when the difference is greater than a predetermined value, said difference is divided by a predetermined number, and then said output control signal is varied a plurality of times stepwise on the basis the divided difference.

* * * * *